(12) United States Patent
Belu

(10) Patent No.: US 6,522,268 B2
(45) Date of Patent: Feb. 18, 2003

(54) SYSTEMS AND METHODS FOR MULTIPLE-FILE DATA COMPRESSION

(75) Inventor: Sabin Belu, Seattle, WA (US)

(73) Assignee: Realnetworks, Inc., Seattle, WA (US)

(*) Notice: Subject to any disclaimer, the term of this patent is extended or adjusted under 35 U.S.C. 154(b) by 0 days.

(21) Appl. No.: 09/754,983

(22) Filed: Jan. 5, 2001

(65) Prior Publication Data
US 2002/0033762 A1 Mar. 21, 2002

Related U.S. Application Data
(60) Provisional application No. 60/174,518, filed on Jan. 5, 2000.

(51) Int. Cl.[7] .............................. H03M 7/00; H03M 7/34
(52) U.S. Cl. .......................................... 341/51; 341/106
(58) Field of Search .............................. 341/51, 55, 63, 341/95, 107, 106; 707/104, 6, 101, 532, 5; 714/18; 345/467; 708/203

(56) References Cited

U.S. PATENT DOCUMENTS

| | | | |
|---|---|---|---|
| 4,464,650 A | 8/1984 | Eastman et al. | 341/51 |
| 4,558,302 A | 12/1985 | Welch | 341/51 |
| 4,701,745 A | 10/1987 | Waterworth | 341/63 |
| 4,814,746 A | 3/1989 | Miller et al. | 341/95 |
| 4,843,389 A * | 6/1989 | Lisle et al. | 341/106 |
| 5,049,881 A | 9/1991 | Gibson et al. | 341/95 |
| 5,051,745 A | 9/1991 | Katz | 341/51 |
| 5,140,321 A | 8/1992 | Jung | 341/55 |
| 5,293,552 A * | 3/1994 | Aalbersberg | 707/5 |
| 5,298,895 A * | 3/1994 | Van Maren | 341/51 |
| 5,473,326 A * | 12/1995 | Harrington et al. | 341/51 |
| 5,530,645 A * | 6/1996 | Chu | 707/532 |
| 5,704,060 A | 12/1997 | Del Monte | 707/104 |
| 6,049,892 A | 4/2000 | Casagrande et al. | 714/18 |
| 6,247,015 B1 * | 6/2001 | Baumgartner et al. | 707/101 |

FOREIGN PATENT DOCUMENTS

| | | |
|---|---|---|
| JP | 3154934 A2 | 7/1991 |
| JP | 4230553 A2 | 8/1992 |
| WO | WO 98/39699 | 9/1998 |

OTHER PUBLICATIONS

Salomon D., "Data Compression: the Complete Reference", 1998, pp. 101–162, 357–360, ISBN: 0–387–98280–9.
Nelson M.R., "Java and the Zip File Format", Dr. Dobb's Journal, vol. 22, Dec. 1997, pp. 50, 52–54, 102, ISSN: 104–789X.
A copy of International Search Report mailed on Jun. 1, 2001 for International App. No. PCT/US 01/00424.

* cited by examiner

Primary Examiner—Patrick Wamsley
(74) Attorney, Agent, or Firm—Knobbe Martens Olson & Bear LLP

(57) ABSTRACT

The systems and methods relate to the compression of multiple files into a single file called an archive. Before appending the multiple files as one file to be compressed, the systems and methods arrange the order of files to increase the potential of redundancy among neighboring files, thus providing potential improvement in compression ratio and compression speed. In using a dictionary method to compress the multiple files appended as one file, a large dictionary is used in one embodiment to take advantage of potential between-file redundancies. In another embodiment, the redundancy characteristics of the multiple files are examined to dynamically determine the dictionary size. After the dictionary compression method produces an intermediary output data file, the intermediary output data may be separated into multiple sections, and a compression method that is potentially suitable for the data characteristics of each section may be applied. The compressed results of each section are then combined to produce the final output.

43 Claims, 5 Drawing Sheets

SYSTEMS AND METHODS FOR MULTIPLE-FILE DATA COMPRESSION

RELATED APPLICATION

This application claims the benefit of U.S. Provisional Patent Application Ser. No. 60/174,518, titled "System and Method for Data Compression" and filed Jan. 5, 2000, the disclosure of which is hereby incorporated by reference.

FIELD OF THE INVENTION

This invention relates to the field of data compression. In particular, it relates to systems and methods of organizing multiple files to be compressed into one archive file, and systems and methods of compressing the multiple files as one unified file.

BACKGROUND

A number of compression methods have been utilized to reduce the size of an input data file by encoding symbols or strings of symbols as numeric codes or combinations of numeric codes and symbols. Such encoding reduces repetitions of symbols in the input data file. Major categories of compression methods include dictionary methods and statistical methods. Dictionary methods encode strings of symbols as tokens using a dictionary. A token indicates the location of the string in the dictionary. Dictionary methods include LZ77, LZ78, LZSS, and LZW. Statistical methods use codes of variable lengths to represent symbols or groups of symbols, with the shorter codes representing symbols or groups of symbols that appear or are likely to appear more often. Statistical methods include the Huffman method and the dynamic Huffman method.

The LZ77 method reads part of the input data into a window. The window is divided into a search buffer (i.e., a dictionary) on the left and a look-ahead buffer on the right. The search buffer is the current dictionary that includes symbols that have been read and encoded. The look-ahead buffer includes data yet to be encoded. The encoder scans the search buffer from right to left looking for a match to the longest stream of symbols in the look-ahead buffer. When the longest match is found, the matched stream of symbols plus the next symbol in the look-ahead buffer are encoded as a token containing three parts, the position (i.e., the distance from the end of the search buffer), the length of the longest match, and the next symbol. For a more detailed description of the LZ77 method please refer to pages 154–157 of *Data Compression the Complete Reference* by David Salomon, Second Edition, 2000. The LZ78 method is a variation of LZ77. For a more detailed description of the LZ78 method please refer to pages 164–168 of *Data Compression the Complete Reference* by David Salomon, Second Edition, 2000.

The LZSS method is a variation of LZ77. Unlike the LZ77 tokens, LZSS tokens use two fields instead of three. An LZSS token includes a position and a length. If no match is found, the uncompressed code of the next symbol is produced as output, with a flag bit to indicate it is uncompressed. The LZSS method also holds the look-ahead buffer in a circular queue and the search buffer in a binary search tree. For a more detailed description of the LZSS method please refer to pages 158–161 of *Data Compression the Complete Reference* by David Salomon, Second Edition, 2000.

The LZW method is a variation of LZ78. For a detailed description of the LZW method please refer to U.S. Pat. No. 4,558,302 issued on Dec. 10, 1985.

The Huffman method, also called the static Huffman method, builds a list of all of the symbols in descending order according to their probabilities of appearance. The method builds a tree from the bottom up with each leaf representing a symbol. The two symbols with the smallest probabilities of appearance are added to the top of the tree and deleted from the list. An auxiliary symbol is created to represent these two symbols. This process is repeated until the list is reduced to one auxiliary symbol. The method then assigns codes of variable length to the symbols on the tree. One variation of the Huffman method is the dynamic, or adaptive, Huffman method. This method assumes that the probabilities of appearance are not known prior to reading the input data. The compression process starts with an empty tree and modifies the tree as symbols are being read and compressed. The decompression process works in synchronization with the compression process. For a more detailed description of the Huffman method and the dynamic Huffman method please refer to pages 62–82 of *Data Compression the Complete Reference* by David Salomon, Second Edition, 2000.

Context based methods are another type of compression methods. Context based methods use one or more preceding symbols to predict (i.e., to assign the probability of) the appearance of the next symbol. For example, in English, the letter "q" is almost always followed by the letter "u". When letter "q" appears, a context based method would assign a high probability of appearance to the letter "u". One example of a context based method is the Markov model which may be classified by the number of proceeding symbols it uses to predict the next symbol. An Order-N Markov model uses the N preceding symbols to predict the next symbol. For a more detailed description of the Markov model, please refer to page 126 and pages 726–735 of *Data Compression the Complete Reference* by David Salomon, Second Edition 2000.

Compression methods may be used by programs to compress multiple files to archives. For example, the ARC program compresses multiple files and combines them into one file called an archive. PKZIP is a variation of ARC. ZIP is an open standard created by the maker of PKZIP for compressing files to archives. For details of ARC and PKZIP please refer to pages 206–211 of *Data Compression the Complete Reference* by David Salomon, Second Edition, 2000. Other compression/archiving programs include ARJ by Robert K. Jung, LHArc by Haruyasu Yoshizaki, and LHZ by Haruhiko Okumura and Haruyasu Yoshizaki.

SUMMARY OF THE INVENTION

The systems and methods relate to the compression of multiple files into a single file called an archive. The systems and methods examine the multiple files to determine their data characteristics. The systems and methods then arrange the order of the multiple files according to their data characteristics to increase the potential of data redundancy among neighboring files. The increased potential of redundancy provides potential improvement in compression ratio and compression speed. The ordered multiple files are then combined as one unified file and compressed.

One embodiment uses a dictionary method to compress the unified file. In addition, a large dictionary is used in one embodiment to take advantage of potential between-file redundancies. In another embodiment, the redundancy characteristics of the multiple files are examined to dynamically determine the dictionary size. After the dictionary compression method produces an intermediary output data file, the intermediary output data may be separated into multiple sections, such that for each section a compression method that is potentially suitable for the data characteristics of that section is applied. The compressed result of each section are then combined to produce the final output.

One embodiment of the present invention is a method of compressing a plurality of files. The method comprises examining said plurality of files to determine data characteristics that correspond to said plurality of files and determining ranking orders for said plurality of files according to said data characteristics. In addition, the method comprises combining said plurality of files into a unified file at least according to said ranking orders and compressing said unified file.

An additional embodiment of the present invention is a system for compressing a plurality of files. The system comprises an examination module configured to examine said plurality of files to determine data characteristics that correspond to said plurality of files and an ordering module configured to determine ranking orders for said plurality of files. In addition, the system comprises a combining module configured to combine said plurality of files as a unified file at least according to the ranking orders of said plurality of files and a compressing module configured to compress said unified file using a first compression method.

A further embodiment of the present invention is a system for compressing a plurality of files. The system comprises means for examining said plurality of files to determine data characteristics that correspond to said plurality of files and means for determining ranking orders for said plurality of files. In addition, the system comprises means for combining said plurality of files as a unified file at least according to the ranking orders of said plurality of files and means for compressing said unified file using a first compression method.

For purposes of summarizing the invention, certain aspects, advantages, and novel features of the invention are described herein. It is to be understood that not necessarily all such advantages may be achieved in accordance with any particular embodiment of the invention. Those skilled in the art will recognize that the invention may be embodied or carried out in a manner that achieves one advantage or a group of advantages as taught herein without necessarily achieving other advantages as may be taught or suggested herein.

These and other features will now be described with reference to the drawings summarized below. These drawings and the associated description are provided to illustrate embodiments of the invention, and not to limit the scope of the invention. Throughout the drawings, reference numbers are re-used to indicate correspondence between referenced elements. In addition, the first digit of each reference number indicates the figure in which the element first appears.

DETAILED DESCRIPTION

I. OVERVIEW

The present invention relates to the compression of multiple files into a single file called an archive. The data characteristics of the multiple files are examined to determine the order in which the files are ranked in a sorted file list. The files are then combined into a single unified file according to the order of the sorted file list and compressed. The ordering of the files increases the potential of repetition among neighboring files and provides potential improvement in compression ratio and compression speed. In one embodiment, the compressed results are compressed a second time.

One embodiment of the systems and methods compresses the ordered files using a dictionary method and utilizing a large dictionary. Such a large dictionary not only has the potential to improve the compression ratio of files with high degree of redundancy within a file, but also has the potential to improve the compression ratio of neighboring files that are somewhat redundant with each other. Because similar files have been placed next to each other in the sorted file list, a large dictionary is likely to take advantage of between-file redundancy to improve the compression ratio of the files. Another embodiment examines the redundancy characteristics of the multiple files to dynamically determine the dictionary size.

In further compressing the intermediary output data already compressed by a dictionary method, one embodiment separates the intermediary output data into multiple sections based on the characteristics of the intermediary output data. The data within each section may have redundancy. Each section of the intermediary output data is compressed using a method that is potentially suitable for compressing data with such characteristics. The compressed results are then combined with header information to form the final output data.

II. MULTIPLE-FILE COMPRESSION SYSTEM

Figure 1:
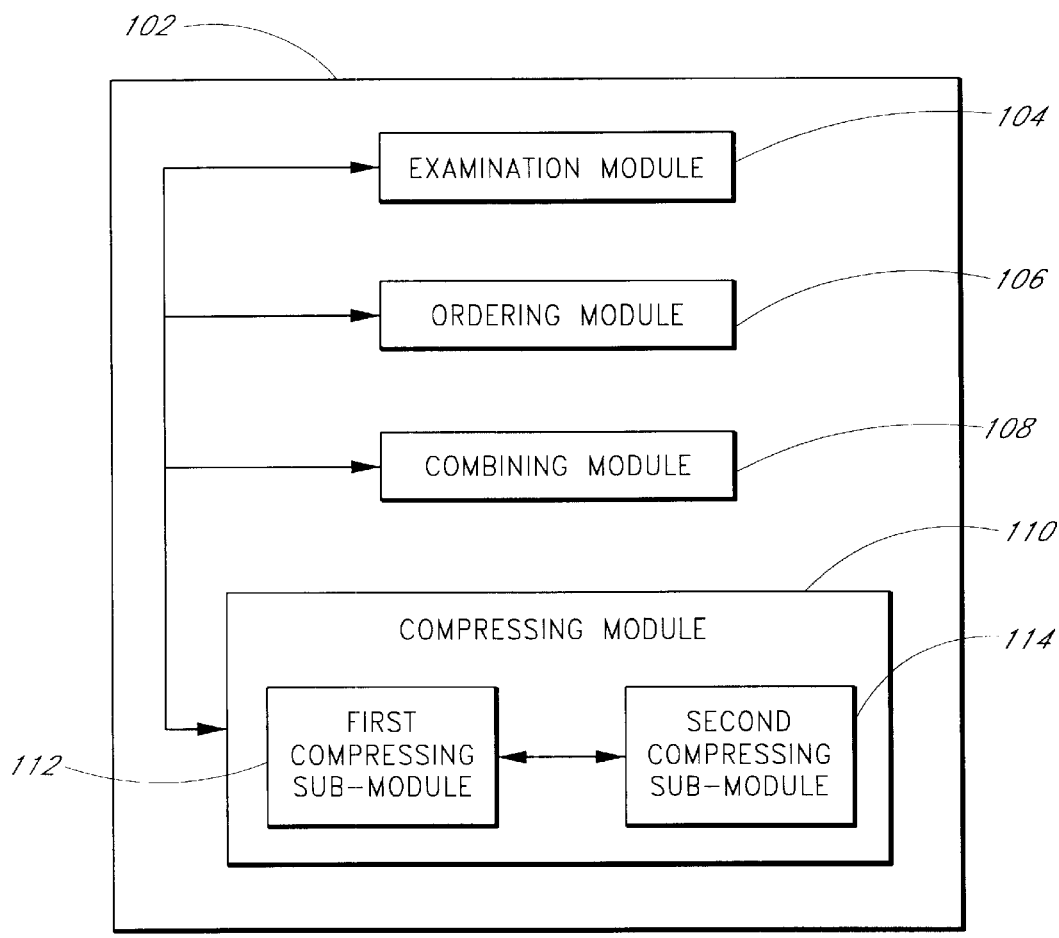
FIG. 1 illustrates a high-level block diagram for one embodiment of a multiple-file compression system.

FIG. 1 illustrates a high-level block diagram of a multiple-file compression system 102. The system 102 includes an examination module 104, an ordering module 106, a combining module 108 and a compressing module 110. One embodiment of the compressing module 110 also includes a first compressing sub-module 112 and a second compressing sub-module 114.

As used herein, the word module, whether in upper or lower case letters, refers to logic embodied in hardware or firmware, or to a collection of software instructions, possibly having entry and exit points, written in a programming language, such as, for example, C++. A software module may be compiled and linked into an executable program, installed in a dynamic link library, or may be written in an interpretive language such as BASIC. It will be appreciated that software modules may be callable from other modules or from themselves, and/or may be invoked in response to detected events or interrupts. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules described herein are preferably implemented as software modules, but may be represented in hardware or firmware.

It should be obvious to those skilled in the art that the modules described in the application may be integrated into fewer modules. One module may also be separated into multiple modules. It should also be obvious to those skilled in the art that the described modules can be implemented as hardware, software, firmware or any combinations of. The described modules may reside at different locations connected through a wired or wireless network.

A. Examination Module

Figure 2:
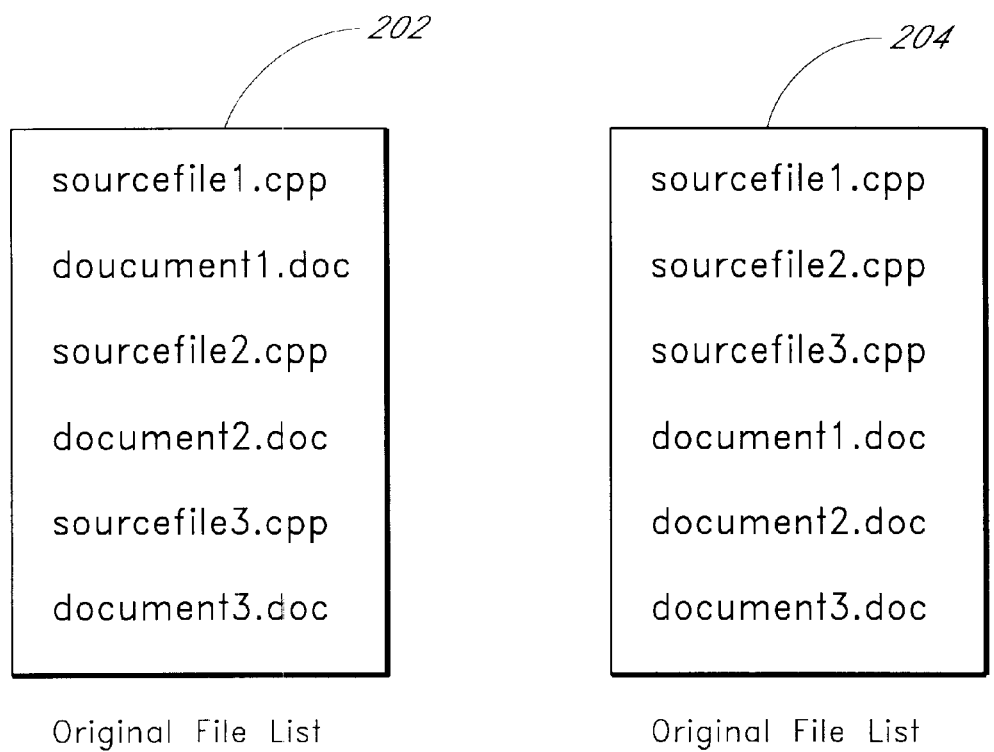
FIG. 2 illustrates one embodiment of an example original file list and one embodiment of an example sorted file list.

The examination module 104 prompts a user to identify an original file list 202. An example of the original file list 202 is illustrated in FIG. 2 and will be discussed further below. Referring back to FIG. 1, the examination module 104 examines the files in the original file list 202 to determine the data characteristics of each file. The examination may include reading all or part of each file, reading attribute/properties information of each file, reading the size, location, name and/or extension of each file, as well as a combination of the above. In one embodiment, the examination module 104 examines the appearance frequencies of "a–Z" alphabets. In another embodiment, the examination module 104 examines the appearance frequencies of numbers.

B. Ordering Module

The ordering module 106 orders files of the original file list 202 into a sorted file list 202. An example of the sorted file list 204 is illustrated in FIG. 2 and discussed further below. Referring back to FIG. 1, files in the sorted file list 204 are ordered according to their data characteristics examined by the examination module 104. Files with similar data characteristics are placed next to each other. The examination module 104 may examine multiple data characteristics of each file, and the ordering module 106 may determine the ordering of the files according to some or all of their multiple data characteristics. For example, files may be sorted by file extension first and then by file name. For another example, files may be sorted by file extension first and then by file size. In one embodiment, the ordering module 106 automatically orders files in the sorted file list. In another embodiment, the ordering module 106 acts as a wizard and provides a user with help information to assist the user in determining the order of the files. Help information may include, for example, the data characteristics of the files.

In addition to using the sorted file list 204, other embodiments may also be used to record the order of files of the original file list 202. For example, each file of the original file list 202 may be assigned an order number indicating the order in which it would be combined by the combining module 108.

C. Combining Module

Figure 3:
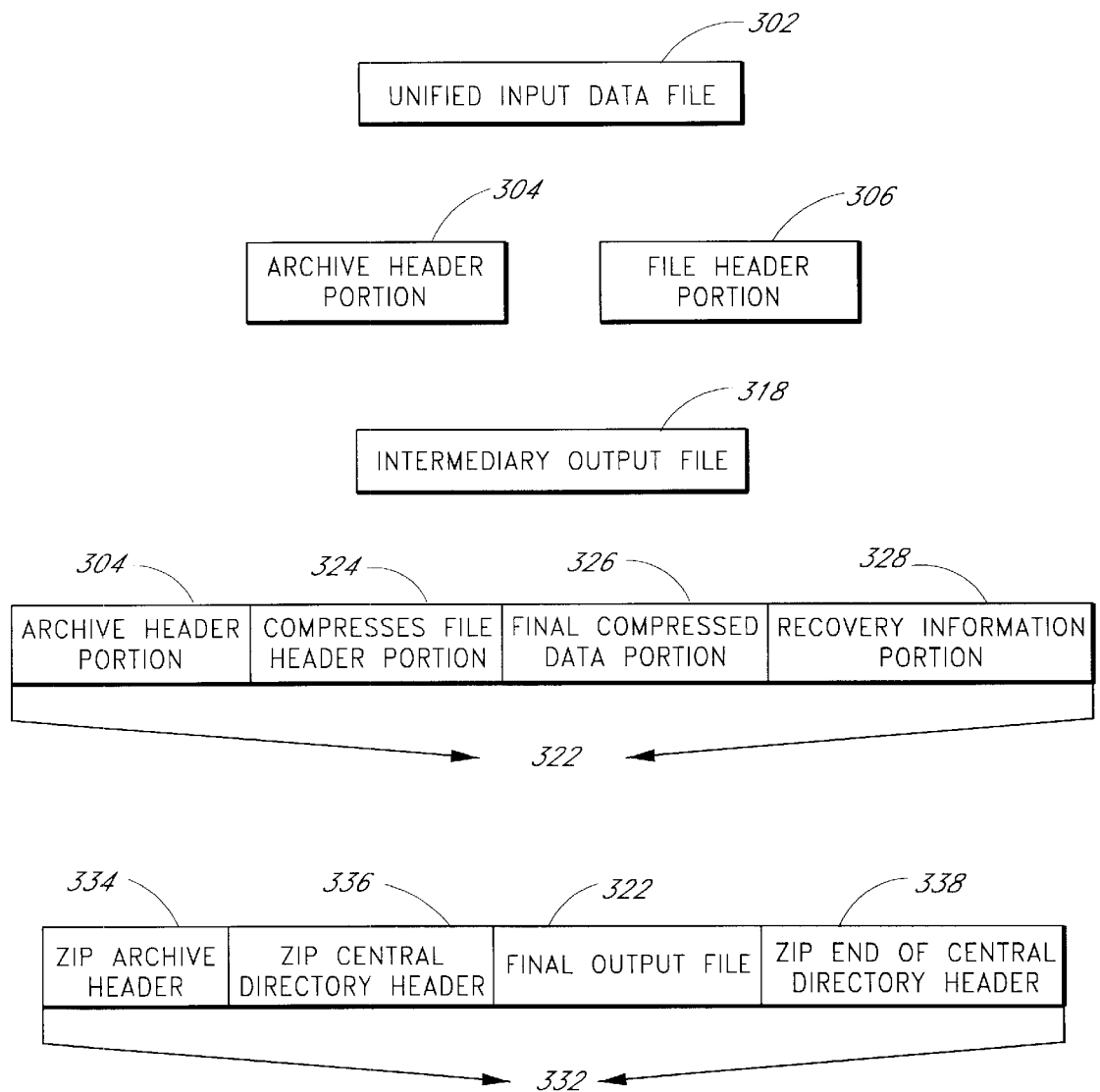
FIG. 3 illustrates one embodiment of a unified input data file, one embodiment of an intermediary output file, and one embodiment of a final output file.

The combining module 108 combines the files successively according to the order in the sorted file list 204, to form a unified input data file 302. An example of the unified input data file 302 is illustrated in FIG. 3 and is discussed further below. Referring back to FIG. 1, the combining module 108 removes the "End-of-File" (i.e., "EOF") marker from each file except for the last file in the sorted file list 204. In one embodiment the combining module 108 also creates an archive header portion 304 and a file header portion 306.

D. Compressing Module

The compressing module 110 applies a first compression method to the unified input data file 302 produced by the combining module 108. In one embodiment, the compressing module 110 applies a dictionary method. The compressing module 110 examines the files in the sorted file list 204 and determines a dictionary size that is likely to be optimal with the redundancy characteristics of the files in the sorted file list 204. In one embodiment, the determination of the dictionary size is made by the examination module 104. The determination of the dictionary size may also be made by the ordering module 106 or by the user. In one embodiment, the compressing module 110 also compresses the file header portion 306 to produce a compressed file header portion 324. The compressing module 110 combines the archive header 304, the compressed file header portion 324 and the compressed result of the unified input data file 302 to produce the final output file 322.

In one embodiment, the compressing module 110 applies a second compression method to the intermediary output file 312 produced by the first compression method. In one embodiment, the compressing module 110 separates the intermediary output file 312 into multiple sections and compresses the data in one or more of the sections. The compressing module 110 then combines the compressed or uncompressed results of all the sections to form the final compressed data portion 326. The compressing module 110 combines the final compressed data portion 326, the archive header portion 304, and the file header portion 306 or the compressed file header portion 324 to form the final output file 322. In one embodiment, a recovery information portion 328 is also appended to the final output file 322. An example of the final output file 322 is illustrated in FIG. 3 and is further discussed below.

One embodiment of the compressing module 110 includes a first compressing sub-module 112 and a second compressing sub-module 114. The first compressing sub-module 112 is configured to apply a first compression method to the unified input data file 302. The second compressing sub-module 114 is configured to apply a second compression method to the intermediary output file 312 produced by the first compression method.

In one embodiment, the compressing module 110 combines the final output file 322 with a ZIP archive header 334, a ZIP central directory header 336, and a ZIP end of central directory header 338 to form a ZIP-recognized output file 332. The ZIP-recognized output file 332 may be recognized by any utility program that supports the ZIP file format. Details of the ZIP headers are described below in the section titled "III. FILE FORMATS."

III. FILE FORMATS

FIG. 2 illustrates an example of an original file list 202 and an example of a sorted file list 204. In this example, the original file list 202 of six files is sorted to produce the sorted file list 204 of the same six files in the same or a different order.

FIG. 3 illustrates an embodiment of a unified input data file 302, an embodiment of an intermediary output file 312, and an embodiment of a final output file 322. FIG. 3 also illustrates an embodiment of an archive header portion 304, an embodiment of a file header portion 306, and an embodiment of a ZIP-recognized output file 332. The exemplary unified input data file 302 is formed by combining all the files in the sorted file list 304. The exemplary intermediary output file 312 includes the compressed result of the unified input data file 302, produced by the first-stage compression process described below.

The exemplary final output file 322 includes an archive header portion 304 that stores information about the archive, a compressed file header portion 324, a final compressed data portion 326, and a recovery information portion 328. The compressed file header portion 324 includes the compressed result of the file header portion 306. The file header portion 306 includes header information about the files in the sorted file list 104, such as the name, location, size and the date and time of creation or modification of each file, and so forth. The final compressed data portion 326 includes the final compressed result of the intermediary output file 312. The recovery information portion 328 includes recovery information about the final compressed data portion 326. The recovery information may include the CRC (Cyclical Redundancy Check or Cyclical Redundancy Code) of the final compressed data portion 326, and in one embodiment, the recovery information portion 328 may be compressed.

While FIG. 3 illustrates embodiments of a unified input data file 302, an intermediary output file 312, and a final output file 322, it is recognized that other embodiments may be used. For example, one embodiment of the final output file 322 may not include a recovery information portion 328.

In one embodiment, a ZIP archive header 334, a ZIP central directory header 336 and a ZIP end of central directory header 338 are combined with the final output file 322 to form a ZIP-recognized output file 332. The formats of the ZIP archive header 334, the ZIP central directory header 336 and the ZIP end of central directory header 338 are maintained as open standards by PKWARE, Inc. located in Brown Deer, Wis. (web site www.pkware.com) The ZIP-recognized output file 332 conforms to the current ZIP file format and can therefore be recognized by any utility program that supports the current ZIP file format.

IV. MULTIPLE FILE COMPRESSION PROCESSES

In one embodiment, the multiple file compression process includes a first-stage compression process and a second-stage compression process.

A. First-Stage Compression

1. Prompt For Original File List

Figure 4:
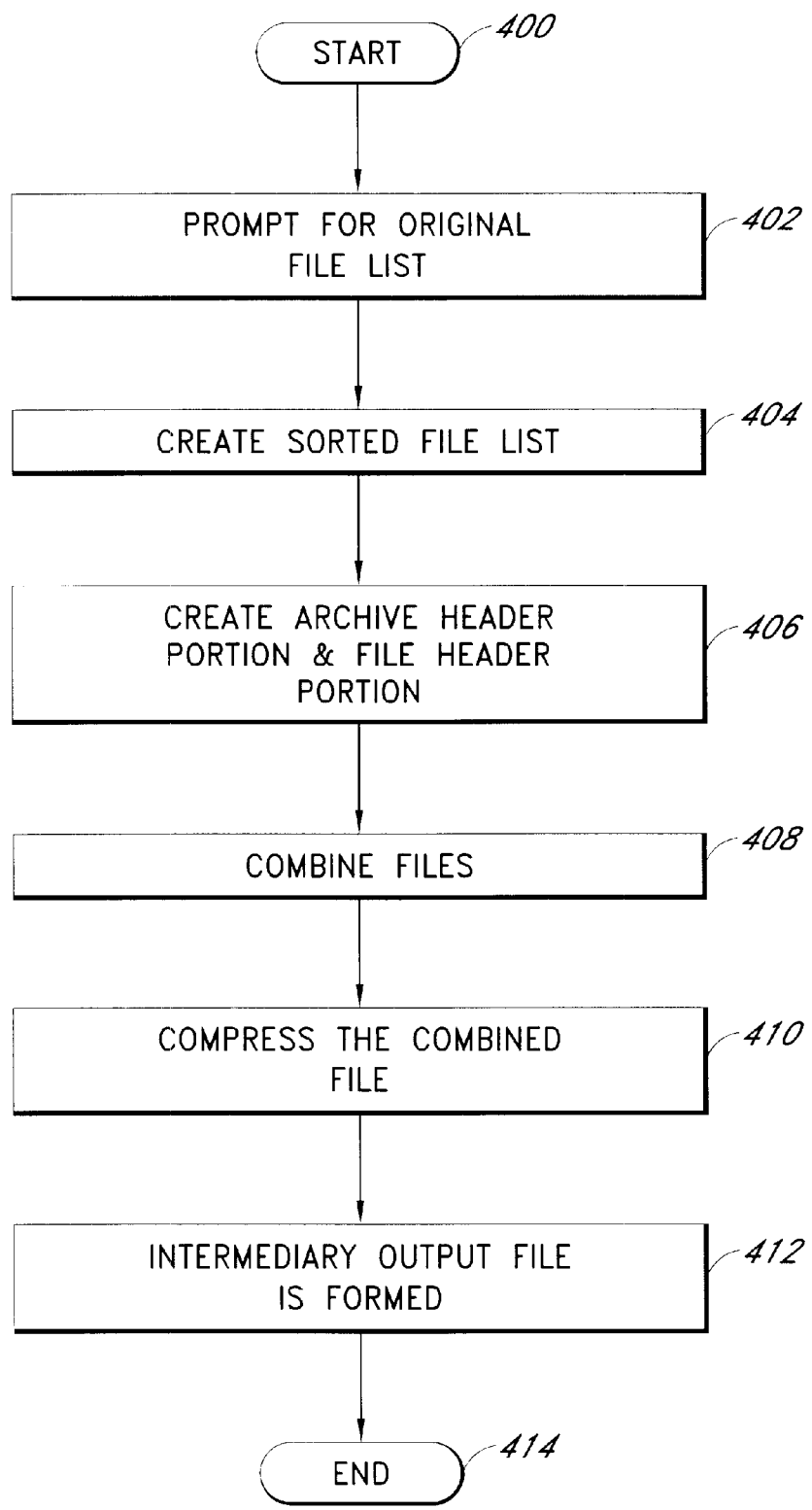
FIG. 4 illustrates a flowchart of one embodiment of a first-stage compression process.

FIG. 4 illustrates one embodiment of a first-stage compression process. Beginning at start state block 400, the first-stage compression process proceeds to block 402 and prompts a user for an original file list 202, which lists the files to be compressed.

2. Create Sorted File List

At block 404, the first-stage compression process converts the original file list 202 into a sorted file list 204 to increase the potential of redundancy among neighboring files in the sorted file list 204. In one embodiment, the original file list 202 is sorted by file extension. For example, files that share the ".doc" extension (i.e., word processing document files) are placed together and files that share the ".cpp" extension (i.e., C++ source code files) are placed together. Because files with the same extension are likely to share more redundancy than files with different extensions, conversion from the original file list 202 into a sorted file list 204 is likely to improve the compression ratio and speed for the first-stage compression. In one embodiment, the original file list 202 is sorted by a combination of file extension and file name. The sorting by file name may further improve the redundancy among neighboring files, such as, for example if some neighboring files are back-up versions of the same master file. In another embodiment, the original file list 202 is sorted by a combination of file extension and file size. For example, files are first sorted by extension, and files of the same extension are then ordered by file size.

In other embodiments, files with the same file type are placed close together in the sorted file list 204. For example, files with the ".doc" extension are placed next to files with the ".txt" extension because they are determined to have the same "text document" file type. Files with the ".exe" extension are placed next to files with the ".dll" extension because they are determined to have the same "binary program" file type. Each file's file type may be determined by using its file extension to look for the corresponding file type in a file extension-file type matching table. The file extension-file type matching table may be created prior to block 402 to assign a file type for each file extension.

In other embodiments, files of the same file group are placed close together in the sorted file list 204. File groups may include, for example, an alphabet-rich file group, a number-rich file group, an image data file group, an audio data file group, a video data file group, a high-redundancy file group, a low-redundancy file group, and so forth. Ordering files by file types and file groups may improve compression ratio and speed because files with the same file type or file group are likely to have more redundancy than other files. File characteristics such as file type and file group may be determined by reading the file extension of a file, reading all or part of a file, reading attribute (also called properties) information about a file, and so forth. Attribute and/or properties information about a file may be included in a header of the file.

In another embodiment, black and white image files may be placed next to each other in the sorted file list 204 and color image files may also be placed next to each other in the sorted file list 204. The color scheme of each image file may be determined by reading the color scheme information from the image file header or by reading all or part of an image file.

In additional embodiments, an artificial intelligence program, a heuristic program, and/or a rule-based program may be used to determine the file orders in the sorted file list 204. For example, the first-stage compression process may read a part of each file in the original file list 202 to determine the data characteristics of each file. Files with similar redundancy characteristics are placed close together in the sorted file list 204. Data characteristics may include the appearance frequency of the "a–Z" alphabet, the appearance frequency of numbers, the appearance frequency of binary codes, and so forth.

In some embodiments, the first-stage compression process automatically carries out the ordering process of block 404. In other embodiments, a user arranges the ordering of files using help information provided by the first-stage compression process. The help information may include the file extension, file type, file group and other data characteristics of each file. Combinations of automatic ordering and manual ordering may also be used. For example, the first-stage compression process may carry out a preliminary ordering of the original file list 202 and may enable the user to adjust the preliminary orders to produce the sorted file list 204.

In addition to using the sorted file list 204, other embodiments may also be used to record the order of files of the original file list 202. For example, each file of the original file list 202 may be assigned an order number indicating the order in which it would be combined at block 408.

3. Create Headers

Still referring to FIG. 4, at block 406, the first-stage compression process creates an archive header portion 304 and a file header portion 306. The archive header portion 304 includes information about the entire archive that is to be created. Such information may include the creation date and time of the archive, the archive's CRC (Cyclical Redundancy Check or Cyclical Redundancy Code), a flag indicating whether the archive is locked, a flag indicating whether the archive is damage protected and so forth. In one embodiment, archive information in the archive header portion 304 may be updated after the compressing of block 410. In another embodiment, archive information in the archive header portion 304 may be updated after the second-stage compression illustrated in FIG. 5 and discussed in further detail below. The file header portion 306 includes file header information for each file in the sorted file list 204. In one embodiment, the file header information for a file may include the file name, the location of the file, the dates and times that the file was created and/or modified, file size prior to compression, and other attribute information about the file such as whether it is read-only.

4. Combine Files

At block 408 of FIG. 2, the first-stage compression process appends all but the first file in the sorted file list 204 successively to the first file in the sorted file list 204. During the appending process, the "End-of-File" (i.e., "EOF") marker, if such a marker exists, is removed from each of the files within the sorted file list 204, except the last file in the sorted file list 204. The data from all the files in the sorted file list 204 forms the unified input data file 302. It is recognized that the first-stage compression process may combine the files using a variety of methods, such as, for example, combining subsets of the set of files in parallel and then merging the combined files together.

5. Compress the Combined File

At block 410 of FIG. 4, the first-stage compression process applies a compression method to the unified input data file 302. A dictionary method, such as the LZSS method, is used in one embodiment, but other compression methods including other dictionary methods may also be applied. The dictionary size may be predetermined prior to the start of the first-stage compression process, or dynamically determined after the start of the first-stage compression process. The dictionary size may exceed a dictionary size unit number of fixed size, such as, for example, one kilobyte, one megabyte, ten megabytes, a hundred megabytes, one gigabyte, and so forth. As the dictionary size grows, the compression ratio may improve but dictionary search speed may decrease. This is because a string of symbols is more likely to find a match in a larger dictionary than in a smaller dictionary, but a large dictionary takes longer to search.

In one embodiment, the first-stage compression process enables a user to specify a dictionary size for compression. This option permits a user to choose a dictionary size that is likely to be optimal with respect to the redundancy characteristics of the sorted file list 204. In another embodiment, the first-stage compression process examines the files of the sorted file list 204 and determines a dictionary size that is likely to be optimal with respect to the redundancy characteristics of the sorted file list 204. In yet another embodiment, the first-stage compression process provides a user with help information, such as the redundancy characteristics, and assists a user to set the dictionary size.

To determine the redundancy characteristics of the sorted file list 204, the first-stage compression process examines information of the sorted file list 204, such as the total size of all files, the size of each file, how many files share the same file group, how many files share the same file type, how many files share the same file name, how many files have similar file names, the number of different file groups and different file types, and so forth. For example, if several files have the same file extension, very similar file names, and very similar file sizes, then these several files may be back-up versions of the same master file. Therefore, the dictionary size may be set at sufficiently more than the file size of each of the several files to take advantage of the high degree of redundancy.

In one example, the first file is read into the dictionary, (because the dictionary size is large enough to allow the entire first file to be read into the dictionary), the rest of the several files may each be encoded as one token with a length close to the size of the first file, plus a few other tokens and/or uncompressed symbols. In another example, a large part of the first file is read into the dictionary. In yet another example, if the file size of every file in the sorted file list 204 is small and very few files share the same file group or file type, thereby indicating a low degree of between-file redundancy, then the dictionary size may be set at a relatively small size so that the speed of searching the dictionary improves.

In one embodiment, the dictionary size is initially set to a default dictionary size. The dictionary size is then increased if certain increment-triggering events are encountered during the examination of each file in the sorted file list 204. These events may include, for example, finding two files of the same file name and extension, finding two files of the same file extension, finding two files of the same file type, finding two files of the same file group, and so forth. Each time one of such increment-triggering events is encountered, the dictionary size is increased. Each of such increment-triggering events may be associated with the same or a different increment amount in dictionary size. Increment amount may be determined as percentages of the size of some or all of the files in the sorted file list 204, as percentages of the default dictionary size, as numbers of bytes, and so forth.

In another embodiment, the dictionary size is decreased if certain decrement-triggering events are encountered. In yet another embodiment, both increment-triggering events and decrement-triggering events may be used to adjust the dictionary size. The dictionary size may also be increased or decreased in proportion to the total size of files in the sorted file list 204 and the average file size.

The examination of the redundancy characteristics and the determination of the dictionary size may also be made at block 404, at the time the first-stage compression process examines the files of the original file list 202 and creates the sorted file list 204.

6. Intermediary Output File Is Formed

After the dictionary size is set and a dictionary method is applied to the unified input data file 302, at block 412 of FIG. 4, the first-stage compression process forms the intermediary output file 312. One embodiment of the intermediary output file 312 includes two types of data: tokens of position/length pairs and uncompressed symbols. A token or an uncompressed symbol is accompanied by a one-bit 0/1 flag that indicates whether it is compressed or uncompressed. This embodiment of the intermediary output file 312 may be produced using LZSS or another dictionary method that produces uncompressed symbols and position/length pairs. After the intermediary output file 312 is produced, the first-stage compression process proceeds to an end state at block 414.

E. Second-Stage Compression

Figure 5:
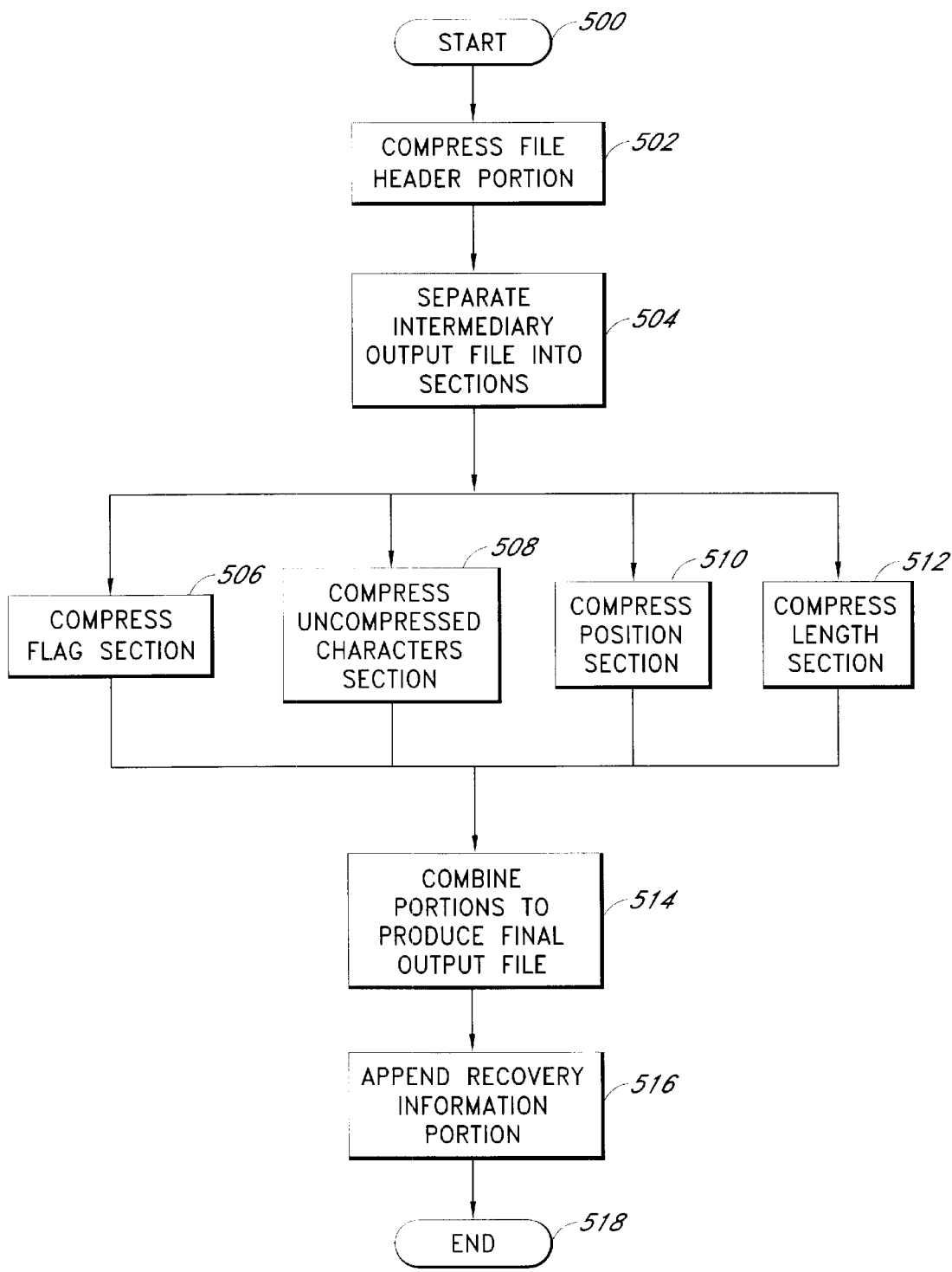
FIG. 5 illustrates a flowchart of one embodiment of a second-stage compression process.

FIG. 5 illustrates a flowchart of one embodiment of a second-stage compression process. The second-stage compression process begins with a start state at block 500 and proceeds to block 502. At block 502, the second-stage compression process compresses the file header portion 306 into the compressed file header portion 324. It should be understood that the first-stage compression process may also be used to compresses the file header portion 306. File header information may include, for example, text identifying the computer on which a file is located, the hard drive on which a file is located, the directory on which a file is located, and so forth. Because multiple files may be located on the same computer, the same hard drive or the same directory, the file header information may include identical sub-strings of substantial length. File header information may also include, for example, the date and time of file creation or modification, and the file size. File header information for such data may also include redundant data. A compression method such as the Order-1 Dynamic Markov model may be suitable for compressing the file header portion 306. The Order-1 Dynamic Markov model uses one preceding symbol to predict (i.e., assign the probability of) the appearance of the next symbol, working dynamically by adjusting probabilities based on prior symbol pairing patterns in this section.

At block 504, the intermediary output file 312 is separated into multiple intermediary output sections. In one embodiment, the intermediary output file 312 is separated into four intermediary output sections: a first section for the 1-bit flags, a second section for uncompressed symbols, a third section for position codes, and a fourth section for length codes. As described in the paragraphs above, in this embodiment, the intermediary output file 312 includes uncompressed symbols and tokens of position/length pairs that are accompanied by a 1-bit flag indicating whether it is compressed. Other embodiments of multiple sections may also be used. For example, one embodiment separates the intermediary output file 312 into two sections, one section for uncompressed symbols and one section for the rest of the intermediary output data.

The second-stage compression process then applies one or more compression methods to the intermediary output sections to take advantage of the data characteristics in each section. The compression of the sections may be carried out in sequence or in parallel. The following paragraphs suggest some compression methods that may be suitable for each of the sections, although other compression methods may also be used. In addition, it may also become desirable to not compress some sections.

Still referring to FIG. 5, at block 506, the second-stage compression process compresses the first section. The first section for the 1-bit flags is characterized by codes representing the binary 0/1 values. Because this section stores codes of binary values, a compression method such as the dynamic Huffman method or the RLE method may be suitable for compressing this section. The RLE (Run Length Encoding) method compresses data by replacing a string of identical symbols (called a run length) with one token. The token stores the symbol and a number representing the length of the run of identical symbols.

At block 508, the second-stage compression process compresses the second section. The second section for uncompressed symbols is characterized by codes representing symbols with no match in the dictionary and are thus uncompressed. Codes representing the "a–z" letters, the "A–Z" letters, and the 0–9 numbers may appear frequently in this section. Therefore, a compression method such as a Pseudo-Contextual method may be suitable for compressing this section. Using the Pseudo-Contextual method, each symbol is assigned to a group. Groups may include the "a–z" letter group, the "A–Z" letter group, and the 0–9 number group. In one embodiment, uncompressed symbols are assigned to up to sixteen groups. A symbol is represented by a group flag and a distance code. The group flag indicates the group to which the symbol is assigned. A distance code indicates the distance between the symbol and the first symbol of the group. For example, a symbol "A" assigned to the "A–Z" group has a distance code of 0, a symbol "C" assigned to the same group has a distance code of 2. Therefore, a symbol "A" in the "A–Z" group and a symbol "0" in the 0–9 group share a distance code of 0. Symbols "A" and "0" are therefore redundant to some degree. The Pseudo-Contextual method then compresses the group flag-distance code pairs.

At block 510, the second-stage compression process compresses the third section. The third section for position codes is characterized by codes representing numbers. These numbers are typically small numbers and are typically less than an upper range such as one thousand or one million, depending on the dictionary size. Therefore, a compression method such as the dynamic Huffman method or the static Huffman method may be suitable for compressing this section.

In one embodiment, the second-stage compression process separates the position codes into multiple sub-sections and compresses the multiple sub-sections. For example, in one embodiment, the second-stage compression process stores the first eight bits of each position code in a first sub-section, and stores the rest of the bits of each position code in a second sub-section. Compared with the original position codes, the data in the first sub-section represent smaller numbers and are likely to have smaller variations. Therefore, compressing the position codes as multiple sub-sections may achieve better compression ratio than compressing the position codes as one section. It should be understood that the fourth section for length codes may also be compressed as multiple sub-sections.

At block 512, the second-stage compression process compresses the fourth section. The fourth section for length codes is characterized by codes representing numbers. These numbers are typically small numbers and are typically less than an upper range such as one hundred or one thousand depending on the dictionary size and the degree of redundancy. Therefore, a compression method such as the dynamic Huffman method or the static Huffman method may be suitable for compressing this section.

Still referring to FIG. 5, at block 514 the second-stage compression process combines the compressed results from blocks 506, 508, 510 and 512 to form the final compressed data portion 326. The second-stage compression process combines the final compressed data portion 326, the archive header portion 304 and the compressed file header portion 324 to produce the final output file 322. In one embodiment, after the compressed file header portion 324 and the final compressed data portion 326 are produced, they are appended successively to the archive header portion 304.

In one embodiment, a recovery information portion 328 is appended to the final output file at block 516. The recovery information portion 328 includes recovery information such as the CRC about the final compressed data portion 326. In one embodiment the second stage compression process prompts a user to determine whether to protect the final output file 322 against damage by appending a recovery information portion 328. In one embodiment, the recovery information portion 328 is also compressed. One embodiment of the final output file 322 includes the file header portion 306 but not the compressed file header portion 324. In one embodiment the second-stage compression process updates the archive header portion 304. In one embodiment, the second-stage compression process combines the ZIP archive header 334, the ZIP central directory header 336 and the ZIP end of central directory header 338 with the final output file 322 to form the ZIP-recognized output file 332, which may be recognized by any utility program that supports the ZIP file format. A utility program that recognizes the ZIP-recognized output file 332 may typically list information such as file names, sizes before compression, sizes after compression and compression ratios of the multiple files in the sorted file list 204, and so forth. The second-stage compression process then proceeds to an end state at block 518.

In another embodiment, the second-stage compression process is omitted; the archive header portion 304, the file header portion 306 (or the compressed file header portion 324 in another embodiment) the intermediary output file 312, and the recovery information portion 328 are combined to form the final output file 322.

Additional embodiments of a multiple-file compression system and processes are illustrated in Appendix A. Furthermore, Appendix B includes one embodiment of a set programming code that implements an embodiment of a multiple file compression system and processes. The disclosed program is written in the programming language C++, though it is recognized that in other embodiments, other languages may be used.

It is recognized that the specification includes the description disclosed in Appendix A and Appendix B. Appendix A and Appendix B form a part of this specification.

III. CONCLUSION

Although the foregoing has been a description and illustration of specific embodiments of the invention, various modifications and changes can be made thereto by persons skilled in the art, without departing from the scope and spirit of the invention as defined by the following claims. One embodiment of the claimed method is implemented in C++ computer programs, although other hardware, software, firmware and combinations may also be used for implementation. Accordingly, the breadth and the scope of the present invention should be defined only in accordance with the following claims and their equivalents.

What is claimed is:

1. A method of compressing a plurality of files to improve a compression ratio, said method comprising:

examining said plurality of files to determine data characteristics that correspond to said plurality of files;

determining ranking orders for said plurality of files according to said data characteristics to improve said compression ratio;

combining said plurality of files into a unified file at least according to said ranking orders; and compressing said unified file.

2. The method of claim 1, wherein compressing said unified file comprises compressing said unified file using a dictionary method.

3. The method of claim 2, wherein compressing said unified file further comprises using a dictionary that is larger than at least one of said plurality of files.

4. The method of claim 2, wherein compressing said unified file further comprises using a dictionary that is larger than each of said plurality of files.

5. The method of claim 2, wherein compressing said unified file further comprises using a dictionary of a predetermined dictionary size.

6. The method of claim 2, wherein compressing said unified file further comprises using a dictionary of a dynamically determined dictionary size.

7. The method of claim 2, wherein compressing said unified file further comprises using a dictionary that is larger than a dictionary size unit number.

8. The method of claim 1, wherein compressing said unified file comprises:

compressing said unified file using a dictionary method to produce an output data file; and compressing said output data file.

9. The method of claim 3, wherein compressing said output data file further comprises compressing said output data file using a statistical method.

10. The method of claim 3, wherein compressing said output data file further comprises:

separating said output data file into multiple sections;

compressing said sections using at least one compression method to produce compressed results for said sections; and combining said compressed results into a final compressed result.

11. The method of claim 1, wherein determining ranking orders comprises listing said plurality of files in a file order list.

12. The method of claim 1, wherein examining said plurality of files comprises examining file extensions of said plurality of files.

13. The method of claim 1, wherein examining said plurality of files comprises examining file names of said plurality of files.

14. The method of claim 1, wherein examining said plurality of files comprises examining file sizes of said plurality of files.

15. The method of claim 1, wherein examining said plurality of files comprises:

determining whether at least one of said plurality of files includes predominantly text;

determining whether at least one of said plurality of files includes predominantly numbers;

determining whether at least one of said plurality of files includes predominantly image data;

determining whether at least one of said plurality of files includes predominantly audio data; and determining whether at least one of said plurality of files includes predominantly video data.

16. The method of claim 1, wherein said compressing said unified file comprises:

compressing said unified file to produce an output data file; and combining said output data file with one or more ZIP support portions to produce a ZIP-recognized output file, said ZIP support portions conforming to a ZIP file format.

17. The method of claim 1, wherein the compression ratio is improved by decreasing the ratio.

18. The method of claim 1 including storing the unified file in an archive.

19. The method of claim 1, including storing compressed files in an archive, and wherein the compression ratio is improved relative to the archive.

20. A system for compressing a plurality of files to improve a compression ratio, said system comprising:

an examination module configured to examine said plurality of files to determine data characteristics that correspond to said plurality of files;

an ordering module configured to determine ranking orders for said plurality of files to improve said compression ratio;

a combining module configured to combine said plurality of files as a unified file at least according to said ranking orders of said plurality of files; and a compressing module configured to compress said unified file using a first compression method.

21. The system of claim 20, wherein said compressing module is further configured to produce an output data file.

22. The system of claim 21, wherein said compressing module is further configured to compress said output data file using a second compression method.

23. The system of claim 21, wherein said first compression method and said second compression method are different.

24. The system of claim 21, wherein said first compression method and said second compression method are the same.

25. The system of claim 21, wherein said compressing module is further configured to combine said output data file with one or more ZIP support portions to produce a ZIP-recognized output file, said ZIP support portions conforming to a ZIP file format.

26. The system of claim 20, wherein said first compression method is a dictionary method.

27. The system of claim 26, wherein said compressing module is further configured to dynamically determine a dictionary size.

28. The system of claim 20, wherein said ordering module is further configured to list said plurality of files in a file order list.

29. The system of claim 20, wherein the compression ratio is improved by decreasing the ratio.

30. The system of claim 20, wherein the unified file is stored in an archive.

31. The system of claim 20, wherein the compressed files are stored in an archive, and wherein the compression ratio is improved relative to the archive.

32. A system for compressing a plurality of files to improve a compression ratio, said system comprising:

means for examining said plurality of files to determine data characteristics that correspond to said plurality of files;

means for determining ranking orders for said plurality of files to improve said compression ratio;

means for combining said plurality of files as a unified file at least according to said ranking orders of said plurality of files; and means for compressing said unified file using a first compression method.

33. The system of claim 32, wherein said means for examining said plurality of files comprises:

means for determining whether at least one of said plurality of files includes predominantly text;

means for determining whether at least one of said plurality of files includes predominantly numbers;

means for determining whether at least one of said plurality of files includes predominantly image data;

means for determining whether at least one of said plurality of files includes predominantly audio data; and means for determining whether at least one of said plurality of files includes predominantly video data.

34. The system of claim 32, wherein the compression ratio is improved by decreasing the ratio.

35. The system of claim 32, wherein the unified file is stored in an archive.

36. The system of claim 32, wherein the compressed files are stored in an archive, and wherein the compression ratio is improved relative to the archive.

37. A computer readable media comprising instructions when executed comprise a method of compressing a plurality of files to improve a compression ratio:

examining said plurality of files to determine data characteristics that correspond to said plurality of files;

ranking said plurality of files according to said data characteristics to improve said compression ratio;

combining said plurality of files into a unified file at least according to said ranking orders; and compressing said unified file.

38. The method of claim 37, wherein examining said plurality of files comprises:

determining whether at least one of said plurality of files includes predominantly text;

determining whether at least one of said plurality of files includes predominantly numbers;

determining whether at least one of said plurality of files includes predominantly image data;

determining whether at least one of said plurality of files includes predominantly audio data; and determining whether at least one of said plurality of files includes predominantly video data.

39. The computer readable media of claim 37, wherein the compression ratio is improved by decreasing the ratio.

40. The computer readable media of claim 37, wherein the unified file is store in an archive.

41. The computer readable media of claim 37, wherein the compressed files are stored in an archive, and wherein the compression ratio is improved relative to the archive.

42. A system for compressing a plurality of files to improve a compression ratio, said system comprising:

an examination module configured to examine said plurality of files to determine data characteristics that correspond to said plurality of files;

an ordering module configured to determine ranking orders for said plurality of files to improve said compression ratio;

a combining module configured to combine said plurality of files as a unified file at least according to said ranking orders of said plurality of files; and a compressing module configured to compress said unified file using a first compression method, wherein said first compression method is a dictionary method.

43. A system for compressing a plurality of files to improve a compression ratio, said system comprising:

an examination module configured to examine said plurality of files to determine data characteristics that correspond to said plurality of files;

an ordering module configured to determine ranking orders for said plurality of files to improve said compression ratio, wherein said ordering module is further configured to list said plurality of files in a file order list, a combining module configured to combine said plurality of files as a unified file at least according to said ranking orders of said plurality of files; and a compressing module configured to compress said unified file using a first compression method.

\* \* \* \* \*